United States Patent [19]

Fest

[11] Patent Number: 4,908,569
[45] Date of Patent: Mar. 13, 1990

[54] TRANSFORMERLESS LINE POWDERED DIGITAL AC VOLTMETER

[76] Inventor: Otto P. Fest, 4016 E. Tennessee St., Tucson, Ariz. 85714

[21] Appl. No.: 230,044

[22] Filed: Aug. 9, 1988

[51] Int. Cl.$^4$ .......................................... G01R 19/22
[52] U.S. Cl. ..................................... 324/120; 324/119
[58] Field of Search .............. 324/126, 127, 128, 119, 324/120; 340/756, 660

[56] References Cited

U.S. PATENT DOCUMENTS

| | | |
|---|---|---|
| 2,724,821 | 11/1955 | Schweitzer . |
| 2,729,788 | 1/1956 | Schweitzer . |
| 3,786,480 | 1/1974 | Hatano et al. ........................ 340/756 |
| 3,840,808 | 10/1974 | Liebermann . |
| 4,409,545 | 10/1983 | Bazin .................................. 324/127 |
| 4,422,039 | 12/1983 | Davis .................................. 324/119 |
| 4,575,225 | 3/1986 | Yuasa et al. .......................... 355/68 |

Primary Examiner—Gerard R. Strecker
Assistant Examiner—Edward Urban
Attorney, Agent, or Firm—J. Michael McClanahan

[57] ABSTRACT

A transformerless line powered digital AC voltmeter for selected voltage ranges is disclosed which takes a minimum of electrical power from the AC line being measured. The AC input is firstly directed to an AC/DC converter to furnish a source of DC operative voltage, the AC/DC converter possessing external electronic circuitry to assure that an adequate minimum voltage appears as its input for any selected voltage range the invention measures. The AC voltage input to be measured is first halfwave rectified, and then voltage divided and smoothed before directed to the input of an A/D converter. The A/D converter has specific external circuitry added to it to assure that the output is accurate over the range of the voltages to be measured. The output of A/D converter is directed to a liquid crystal display which visually indicates the AC voltage measured. A external electronic circuit determines the decimal point for the voltage range measured.

7 Claims, 1 Drawing Sheet

TRANSFORMERLESS LINE POWERED DIGITAL AC VOLTMETER

BACKGROUND OF THE INVENTION

1. Field of the invention

The field of the invention is AC digital voltmeters which derive their operative power from the AC voltage being tested, and not from a separately supplied external electrical energy source.

2. Description of the related art

Conventional precision digital AC voltmeters require that an external or internal source of electrical power be connected with the voltmeter in order to power the internal operative electronic circuits. There are direct reading AC and DC voltmeters which do not require an external power source, but read direct from the line being measured, such as when the line voltage to be read deflects a galvanometer type needle. To the Applicant's knowledge, however, all available digital AC voltmeters utilize an internal or external power source as their source of operative electrical power.

Those AC and DC analog voltmeters which operate with a galvanometer type meter action do suffer from the shortcoming in that they are of rather low input impedance, and require a substantial amount of current to deflect the meter. Consequently, these meters tend to pull down the voltage which is being measured such that, except for the cases where the output impedance of the device supplying the AC or DC voltage to be measured is extremely low (relative to the meter input impedance, such as the 60 Hz home or factory electrical power source), the voltage reading is distorted and a true and accurate AC or DC voltage is not displayed.

Other problems inherent with analog and digital meters known to the Applicant, aside from their lack of accuracy, are such things of bulkiness, fragility, and paralax in meter reading. Additionally, many conventional available analog and digital meters require an additional power source to illuminate its display for night viewing. Further, if a digital meter is to operate at sub-zero temperatures, conventional digital voltmeters require an external source to maintain temperature of certain elements of the voltmeter.

Now it would be possible to construct a digital AC voltmeter which utilizes the line voltage being measured to power the electronic circuits of the voltmeter, however, conventional design dictates that the AC input being measured also be directed to a transformer for rectification to supply the necessary DC voltage to operate the meter. However, digital AC voltmeters constructed along these lines suffer from at least three major shortcomings, the first being that the transformer presents a relatively low input impedance to the line being measured, and therefore becomes a drag on the AC voltage input, such as to distort the true voltage reading. Secondly, transformers are inherently frequency sensitive. A transformer which operates at maximum efficiency at 60 Hertz has fallen off considerably at, for example, 1000 Hertz, and may be totally inoperative as a transformer at 10 kHz. Lastly, transformers are bulky and heavy, making the AC digital voltmeter heavy and detracting from the ease of operation.

It is overcome these shortcomings that Applicant's inventive transformerless line powered AC digital voltmeter is directed. Accordingly, it would be useful to provide the accuracy of digital techniques by a transformerless line powered AC digital meter which obtains its operative power from the AC line being measured, but yet is of a high input impedance and draws very little current from the line being tested, while at the same time is compact, avoids paralax problems inherent with analog type display meters, and is highly accurate and very light weight.

SUMMARY OF THE INVENTION

This invention relates to digital AC voltmeters, and in particular digital AC voltmeters which require very little power to operate and obtain their operative power from the AC line being tested and, in addition, do not burden the AC line being tested with a transformer. To this end, the subject invention receives the electrical AC input being measured and firstly directs it to an AC/DC converter which supplies a constant DC voltage output for use by the remaining components in the invention. The AC/DC converter input circuitry is designed so that for the voltage range the subject invention is designed to measure, an AC voltage not less than a required minimum level is always presented to the AC/DC converter inputs. Further, the AC voltage input is half wave rectified and then voltage divided and smoothed before it is directed to the input of an A/D converter. The A/D converter has further associated with it electrical circuitry by which the accuracy of the voltage input is maintained over the range of voltage the invention is designed to measure. The output of the A/D converter is directed to a liquid crystal display for visual indication of the measured voltage. The liquid crystal display decimal point is determined by electronic circuitry external to the display by which the decimal point is pre-selected for the voltage range to be measured during the period of instrument construction.

It is an object of the subject invention to provide a line powered digital AC voltmeter which has a high input impedance and operates on minimal current drain from the AC voltage measured.

It is another object of the subject invention to provide a line powered digital AC voltmeter which does not require the use of a transformer to supply operative electrical power for the operative components of the voltmeter.

It is still another object of the subject invention to provide a line powered digital AC voltmeter which is not sensitive to the frequency of the AC voltage being measured that a line powered digital voltmeter utilizing a transformer has.

It is still another object of the subject invention to provide a line powered digital AC voltmeter having the accuracy of conventional AC digital voltmeters which utilize separate and external sources of operative power.

Other objects of the invention will in part be obvious and will in part appear hereinafter. The invention accordingly comprises the apparatus and method comprising the construction, combination of elements, and arrangements of parts which are exemplified in the following detailed disclosure, and the scope of the Application which will be indicated in the claims.

BRIEF DESCRIPTION OF THE DRAWINGS

For further understanding of the nature and objects of the present invention, reference should be had to the following detailed description taken in connection with the accompanying drawings wherein.

In various views, like index numbers refer to like elements.

DETAILED DESCRIPTION OF THE PREFERRED EMBODIMENT

Figure 1:
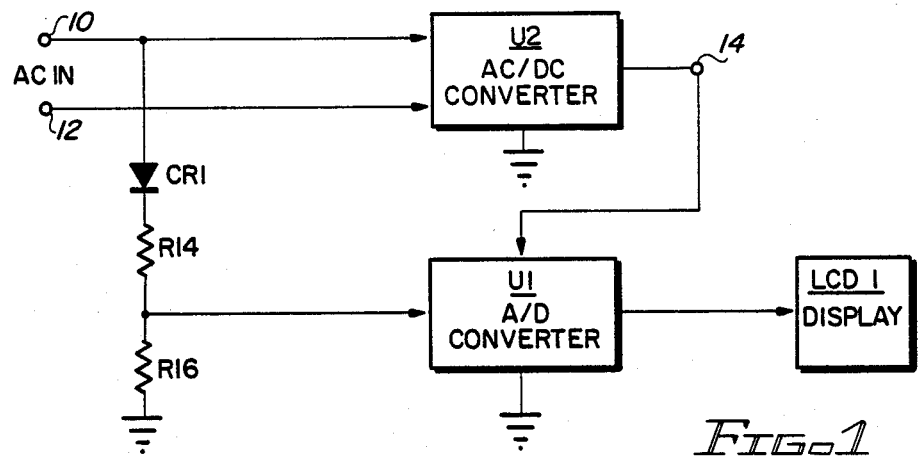
FIG. 1 is a block schematic diagram of the subject invention.

Referring firstly to FIG. 1, a block schematic diagram of the inventive transformerless line powered digital AC voltmeter is detailed. As shown in FIG. 1, the digital AC voltmeter comprises three main modules and circuitry interconnecting these modules. The AC voltage (alternating current voltage) to be measured is directed to input terminals 10 and 12 of the digital AC voltmeter where, for convenience, terminal 10 is considered the high side. Terminal 12 therefore is the low side, although terminal 12 is not grounded directly to the chassis ground of the subject digital volt meter. The AC voltage is conducted from the instrument input terminals 10 and 12 to the means providing the operative DC voltage to the remainder of the invention, namely electronic module U2 comprising an AC/DC (alternating current to direct current) converter. Output terminal 14 of module U2 outputs a constant DC voltage providing the input to module U2 is above a minimum specified AC voltage. In the more detailed schematic of FIG. 2, methods are detailed including added circuitry to assure that the input to module U2 is above the required minimum voltage for various AC voltage ranges expected to be measured.

The high side of the AC voltage input at terminal 10 is directed to the means by which the AC voltage is modified, namely firstly a half-wave rectifier and voltage divider network comprising diode CR1 and series resistors R14 and R16. The voltage between the two resistors is tapped off and directed to module U1, the A/D converter. In addition, the DC voltage output of module U2, terminal 14, is also received by module U1. The A/D converter outputs signals upon a plurality of lines digitally equivalent in numeric value of the analog voltage input to the A/D converter.

The digital output of module U1 is directed in a plurality of connections (although only 1 line is shown in FIG. 1) to the means by which the digital signals are received and visually displayed in a readable form, namely module LCD1, a liquid crystal display. The output of module LCD1 is displayed upon a panel having four digits with a decimal point at a chosen position proximate one of the digits. The choosing of the decimal point is detailed in the description relative to FIG. 2. The digital readout illustrated on the face of LCD1 is indicative of the AC voltage present at input terminals 10 and 12.

It is noted that ground connections are shown attaching to each of the modules and to one leg of resistor R16. This ground is common for all the modules and circuitry shown, but is not common to or directly connected to the low side of the AC voltage input, namely terminal 12. The ground shown in FIG. 1 is related to the high and low side of the AC input at terminals 10 and 12 only through diode CR1 and voltage divider resistors R14 and R16, as well as connections which may exist internally to the modules U2 and U1.

Figure 2:
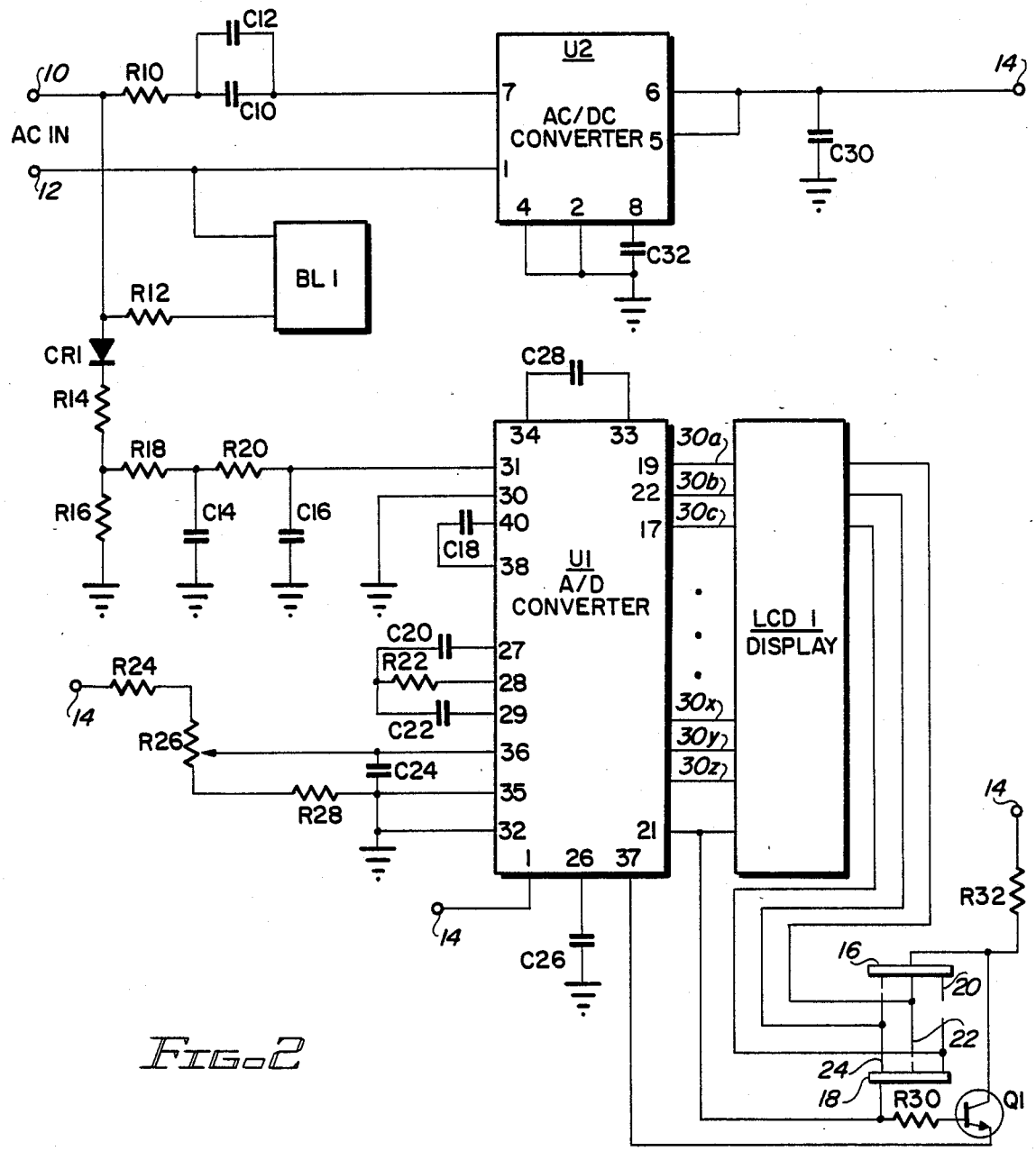
FIG. 2 is a detailed schematic drawing of the invention.

Referring now to FIG. 2, a complete schematic of the subject invention is shown expanding upon the block schematic diagram of FIG. 1. First seen is that the major module components are shown with more electronic circuitry attached, however, as such, the circuitry prepares the modules for the particular AC voltage range to be measured. Input terminals 10 (high side) and 12 (low side) are firstly directed to module U2 with current-limiting resistor R10 and parallel current-limiting capacitors C10 and C12 situated in series between terminal 10 and the input to module U2. Depending upon the range of AC voltages to be measured, varied resistor R10 and capacitor C12 are utilized. Capacitor C12, being in parallel with capacitor C10, is directly additive to capacitor C10, adding to its capacitance as needed to assure a minimum 10 V AC at the input to module U2 for different voltage ranges over which the instrument measures. Table 1, later discussed, sets out the preferred resistances and capacitances for resistor R10 and capacitor C12 for different input AC voltage ranges. In order to output a constant +5 volts DC on output pin 14, the input to module U2 must be at least 10 volts AC RMS. Connected also to module U2 at pin 8 is filter capacitor C32, required in order to filter the output voltage required. Attached to terminals 5 and 6 of module U2 is also capacitor C30, capacitor C30 acting to smooth the output of terminal 14. Nominally, with the input resistors and capacitors, R10 and C10 and C12, and capacitors C32 and C30, the voltage at terminal 14 is a positive regulated 5 volts.

TABLE 1

| Input Voltage Range VAC | Resistors | | Capacitors | |
|---|---|---|---|---|
| | R10 (Ohms) | R12 (Ohms) | C10 (uf) | C12 |
| 12–130 | 20K | 5.1K | 0.22 | 0.22 |
| 50–200 | 30K | 5.1K | 0.22 | None |
| 100–500 | 220K | 47K | 0.22 | None |

Also attached to the input terminals 10 and 12 is module BL1, the high side input to module BL1 connected to the high side of the AC voltage input to resistor R12. Module BL1 is the backlight panel for the digital readout of module LCD1 and is necessary when the subject invention is used in a darkened area. If it is anticipated that the subject digital AC voltmeter will always be used in a lighted area, module BL1 may be disconnected or deleted from the circuitry.

Continuing, as previously discussed in connection with FIG. 1, the means by which the AC voltage to be measured is received and converted to digital electrical signals is detailed. Firstly, the AC input voltage high side is directed through the half wave rectifier and voltage divider circuit comprising diode CR1 and series resistors R14 and R16. As shown in FIG. 2, diode CR1 is connected to terminal 10 and then to resistor R14. The connection between resistors R14 and R16 is tapped with series rsistor R18 which continues on to resistor R20. The lower resistor R16 continues to ground. Capacitors C14 and C16, attaching to resistors R18 and R20 respectively, perform the function of a resistive-capacitive smoothing circuit. The signal passing through the half wave rectifier CR1 comprises only the positive going portions of the AC input voltage, the negative going portions of the sine wave rejected or stopped by diode CR1. Thus the resistive-capacitive smoothing circuit of resistors R18 and R20 and capacitors C14 and C16 tend to smooth out the formerly alternating current and now direct current voltage wave passed by diode CR1 and to fill in with current that portion of the voltage wave between positive going half sine waves. The output of the resistive-capacitive smoothing circuit is directed to the input of module U1, the A/D converter, where the DC voltage is measured.

Connected to module U1 at the pins noted are various circuit elements necessary to achieve a digital voltage output which is numerically equal to the smoothed analog DC voltage.

Pin 31 of module U1 is the positive input side of the analog voltage to be measured, and pin 30 is the low side or negative input. Since a half-wave rectifier was utilized, only the positive going sine waves are passed, and the negative input to module U1 pin 30 is grounded. To pins 38 and 40 are attached the charge pump capacitor C18 which permits the module to measure both positive and negative input voltages although only positive voltage is measured in the preferred embodiment. Pins 33 and 34 have connected between them reference capacitor C28 which provides a reference voltage to the module during the de-integration phase of the A/D converter cycle. Attached to pins 35 and 36 is the circuitry which permits adjustment of the internally used reference voltage by means of variable resistor R26. Resistor R24, which is connected to one leg of variable resistor R26, has its other leg attached to terminal 14, which is the DC supply voltage furnished by module U2. The other leg of variable resistor R26 is attached to resistor R28 which in turn is connected to terminal 35. The center movable tab of variable resistor R26 is attached to module pin 36 with capacitor C24 connecting terminals 35 and 36. By adjustment of resistor R26, the reference voltage is supplied to module U1 which allows for calibration of the AC digital voltmeter for different input voltage ranges. Pin 32 of module U1 is the module ground and is the ground common to the circuit shown in FIG. 2. Capacitors C20 and C22, together with resistor R22, all having a common tie point are connected respectively to pins 27, 28, and 29 of module U1. The components shown attached to these pins 27, 28, and 29 respectively, control the integration rate of module U1.

In the preferred embodiment, module U1 also contains the display drivers in order that the plurality of outputs of the module U1 may be directly attached to the means by which the voltage is visually displayed.

Connected to Module U1 by a plurality of connectors 30a through 30z as needed, is the liquid crystal display (LCD1) which is known as a 3½ digit display.

The liquid crystal display which was utilized in the preferred embodiment was model 3906-260-X70 manufactured by Hamlin, Inc. of Lake Mills, Wisc. 53551. As such, it requires direct connection of each digital lead from the A/D converter, module U1, shown in FIG. 2. Connection of the various leads are in accordance with the manufacturers' specification. Also shown connected to LCD1 is the means by which LCD1 is driven and the selection of the decimal point.

In particular, the decimal point selection circuitry consists of transistor Q1 and resistors R30 and R32 providing an electrical assymmetrical square wave to drive the decimal points of LCD1. More particularly, one leg of resistor R32 is connected to terminal 14, the source of positive DC voltage from module U2, and the other leg connected to the collector of transistor Q1. The emitter of transistor Q1 is connected to pin 37 of module U1. The base of transistor Q1 is connected to resistor R30 which receives a symmetrical square wave from module U1, the symmetrical square wave also directed from module U1 to LCD1. The symmetrical square wave output from the module U1 is additionally directed to the bottom terminal of DPC1, known as the back plane. DPC1 comprises a structure similar to its drawn appearance in FIG. 2 wherein, two of the three legs between the end bars are severed in order that only one of the three leads to LCD1 is activated.

Connecting to the lower bar 18 of DPC1 is the output of pin 21 of module U1 which also provides the base drive for transistor Q1, the base drive being the symmetrical square wave which also drives LCD1 through its connection with module U1. Connecting to the upper bar 16 of DPC1 is the output of transistor Q1. The three lines connecting the upper and lower bars 16 and 18 respectively of DPC1 are leads 20, 22, and 24, two of which will be cut or severed during instrument fabrication depending upon the range of voltage which is selected for the instrument to measure. in FIG. 2, leads 20 and 24 have been severed from upper bar 16 and lead 22 severed from lower bar 18 leaving lead 22 connecting the upper bar to the horizontal lead to LCD1. With lead 22 connected, the decimal point will be set immediately to the left of the second digit from the right on the liquid crystal display. Since, in the preferred embodiment, the liquid crystal display is of the 3½ digit type, the decimal point would reside immediately to the left of second digit, reading right to left, for example, XX.XX. If leads 20 and 22 were severed from bar 16 and lead 24 severed from bar 18, then the readout from LCD1 would be XXX.X. Lastly, if leads 22 and 24 were severed from bar 16 and lead 20 severed from bar 18, then the readout on LCD1 would be X.XXX.

It is noted that the signal which appears on bar 16 is exactly opposite in phase to the signal which appears on bar 18, inasmuch as there is a phase reversal through transistor Q1.

Effectively then, the decimal point selection circuitry detailed above operates in conjunction with the voltage range selector since all four digital display digits are always utilized and the decimal point chosen must allow sufficient digits left of the decimal point to display the highest voltage possible in each voltage range as shown in Table 1.

Referring to Table 2, values of the components shown in FIG. 2 are set out as used in the preferred embodiment.

TABLE 2.

| Resistors (Ohms) | | Capacitors (uf) | |
| --- | --- | --- | --- |
| R14 | 1M | C14 | 0.1 |
| R16 | 22K | C16 | 0.1 |
| R18 | 1M | C18 | 2.2 |
| R20 | 1M | C20 | 0.22 |
| R22 | 1.8M | C22 | 0.47 |
| R24 | 243K | C24 | 0.1 |
| R26 | 200K | C26 | 2.2 |
| R28 | 49.9K | C28 | 0.1 |
| R30 | 47K | C30 | 10 |
| R32 | 47K | C32 | 100 |

Module U1 - Maxim, Model 138 A/D Converter
Module U2 - Maxim, Model 610, AC/DC Converter
LCD1 - Hamlin, Inc. Model 3906-260-X70
Q1 - 2N3904
BL1 - Luminescet Technologies Model 431

While a preferred embodiment of the subject invention has been shown and described, it will be understood that there is no intent to limit the invention by its disclosure, but rather it is intended to cover all modifications and alternate constructions falling within the spirit and the scope of the invention as defined in the appended claims. For example, the A/D converter described as module U2 in the description of the Figures is of the "dual slope type", however, such disclosure is not intended to limit this invention to this particular type of A/C converter.

I claim:

1. A transformerless line powered digital AC voltmeter for measuring AC voltage on an electrical line obviating the need for a separate internal electrical battery or external source of electrical power for the voltmeter operative electrical power comprising:

means operably connected to the electrical line to receive the AC voltage to be measured, said means converting the AC voltage to digital electrical signals for a digital output indicative of the AC voltage input, said AC voltage converting means including a half wave rectifier and voltage divider circuit to convert the AC voltage to half wave DC voltage and reduce its magnitude, DC voltage modification means operably receiving the reduced half wave DC voltage, and an A/D converter connected to said DC voltage modification means;

means operatively connected to said A/D converter to receive said digital electrical signals and visually display them in a readable form; and means operably connected to the electrical line being measured and to said AC voltage converter means providing a source of operative DC electrical power to said AC voltage converter means, said means including an AC/DC converter and circuit means to assure that a minimum AC electrical voltage input to said AC/DC converter is provided, said circuit means assuring minimum AC voltage input defining a series resistor-capacitor circuit interposed the electrical line measured and said AC/DC converter.

2. The transformerless line powered digital AC voltmeter as defined in claim 1 wherein said DC voltage modification additionally includes an electrical smoothing circuit whereby the DC voltage output of the half-wave rectifier and voltage divider circuit is smoothed before connecting to said A/D converter.

3. The transformerless line powered digital AC voltmeter as defined in claim 2 wherein said electrical smoothing circuit includes a series resistor and parallel capacitor to ground.

4. The transformerless line powered digital AC voltmeter as defined in claim 3 wherein said electrical smoothing circuit further includes a second series resistor and parallel capacitor to ground.

5. The transformerless line powered digital AC voltmeter as defined in claim 4 wherein said means operably connected to said A/D converter means to receive said digital electrical signals and visually display them includes a liquid crystal display, said liquid crystal display operably connected to said A/D converter by a plurality of electrical lines.

6. The transformerless line powered digital AC voltmeter as defined in claim 5 further including a decimal point selector, said decimal point selector operably connected to said A/D converter and said liquid crystal display, said decimal point selector providing means for selecting a decimal point for the voltage range over which the digital AC voltmeter shall display the received digital electrical signals in a readable form.

7. The transformerless line powered digital AC voltmeter as defined in claim 6 further including a back light panel operably connected to said liquid crystal display and to the electrical line being measured, said back light panel providing a source of light to enhance readout of said liquid crystal display.

* * * * *